United States Patent [19]

Ida

[11] 4,177,434

[45] Dec. 4, 1979

[54] CONSTANT AMPLITUDE CONTROL OF ELECTROMECHANICAL OSCILLATORS

[75] Inventor: Edward S. Ida, Newark, Del.

[73] Assignee: E. I. Du Pont de Nemours and Company, Wilmington, Del.

[21] Appl. No.: 910,849

[22] Filed: May 30, 1978

[51] Int. Cl.$^2$ .................. G01N 11/16; H03B 5/30; H03B 3/02

[52] U.S. Cl. .................. 331/27; 331/116 M; 331/156; 331/183; 73/59; 73/646; 318/128; 318/132

[58] Field of Search .................. 331/116 M, 154, 156, 331/157, 155, 183, 25, 27; 318/114, 116, 118, 128, 130, 132; 310/25, 26, 27, 37; 73/646, 647, 648, 54, 59, DIG. 1, DIG. 2, 32 A, 579; 332/3; 58/23 AC, 23 TF, 23 V

[56] References Cited

U.S. PATENT DOCUMENTS

| | | | |
|---|---|---|---|
| 2,469,264 | 5/1949 | Goldberg | 331/156 |
| 3,384,837 | 5/1968 | Toussaint et al. | 332/3 |
| 3,609,578 | 9/1971 | Chapman et al. | 331/156 X |
| 3,710,614 | 1/1973 | Oppliger | 73/59 |
| 3,712,117 | 1/1973 | Fitzgerald et al. | 73/59 |
| 3,796,088 | 3/1974 | Gustafsson et al. | 73/59 |
| 4,049,997 | 9/1977 | McGhee | 318/128 |
| 4,118,674 | 10/1978 | Ball | 331/25 X |

OTHER PUBLICATIONS

Oshiro, "Exclusive-or IC's Serve for Phase-Locking Tasks", Electronics, Jun. 22, 1970, p. 83.
Simson et al., Automatic Internal Friction and Modulus Measurement Apparatus Utilizing a Phase-Locked Loop; Rev. Sci. Instrum., vol. 48, No. 11, Nov. 1977; pp. 1392-1396.

Primary Examiner—Siegfried H. Grimm
Assistant Examiner—Edward P. Westin

[57] ABSTRACT

Method and system for the constant amplitude control of an electromechanical oscillator utilizing a phase locked oscillator to generate a secondary a-c setpoint which is compared to the oscillator output to provide a difference signal which is passed as a fast-acting negative feedback signal to stabilize the amplitude.

5 Claims, 5 Drawing Figures

CONSTANT AMPLITUDE CONTROL OF ELECTROMECHANICAL OSCILLATORS

FIELD OF THE INVENTION

This invention relates to electromechanical oscillators and, more particularly, to a method and system for maintaining the mechanical output signal of such systems at a constant amplitude.

BACKGROUND

Electromechanical oscillators are frequently used to measure changes in the physical properties of a given mass, usually by transducing these changes into changes in the operating frequency of the measuring instrument. Examples of such oscillators include density meters, mechanical analyzers, viscometers, moisture meters and temperature meters.

In viscometers, for example, precise amplitude control is a critical requirement. The driving effort needed to maintain oscillation at a constant amplitude, corresponding directly with the rate of decay (or damping) of the amplitude of oscillation, is a function of viscosity of the sample material.

In addition, the elastic properties of the material can be determined by measuring the phase angle between the driving signal and the probe output signal. These relationships are well known; e.g., see U.S. Pat. No. 3,501,952 and R. Darby *Viscoelastic Fluids*—Marvel Decker (1976).

Referring to the latter reference, it is shown that by maintaining the amplitude of oscillation constant, assuming negligible variation in frequency and a linear sample material, the real or viscous component of viscosity relates directly to the average power required to drive the probe. On the other hand, to determine elasticity (or the complex component of viscosity) it is the small variation in frequency which needs to be measured.

The usual practice, such as disclosed in U.S. Pat. No. 3,712,117 and U.S. Pat. No. 3,710,614, for controlling probe oscillation amplitude has been to rectify (or detect) the amplitude of the oscillator signal, compare it with a d-c setpoint value, and then apply the difference signal as a proportional correction in the strength of the positive feedback for driving the probe. A deficiency in such a control system is that phase delays in detector response to the probe output signal affect loop stability and therefore restrict the amount of proportional gain which the system can tolerate. This limits the degree of precise amplitude regulation which can be applied. Furthermore, in an industrial environment, the inability of a fast response detector system to signal average makes this system particularly sensitive to extraneous background noise.

Phase-locked loop (PLL) circuits have recently been applied in electromechanical systems as a means for automatically tracking rapid changes in a probe frequency with negligible phase error over a narrow band of frequencies and for producing a constant amplitude drive signal. Such an application of the PLL has been described recently by H. M. Simpson and A. Sosin, *Automatic Internal Friction and Modulus Measurement Apparatus Utilizing a Phase-Locked Loop*—Rev. Sci. Instrum., Vo. 48, No. 11, November, 1977.

Other means for regulating the drive signal to maintain a constant amplitude probe oscillation are known in the art. One such means, described in the foregoing Simpson et al. reference, uses the integrated difference between a d-c setpoint voltage and the d-c converted probe signal to adjust the level of the drive. A problem here is that the system's response to change is rather slow and stability is reduced by the absence of proportional control action. Another means, described in U.S. Pat. No. 4,049,997, switches a drive signal, derived in a manner similar to that described by Simpson et al., at a rate determined by the occurrences of the zero-crossing points of the a-c probe signal. Again, the time response of such systems is somewhat limited.

SUMMARY OF THE INVENTION

Generally, this invention comprises a method and a system for the constant amplitude control of electromechanical oscillators utilizing a phase-locked oscillator circuit to generate a secondary a-c set-point which, after comparison with the electromechanical oscillator output signal, provides a difference signal for transmission through a separate proportional and fast-acting negative feedback loop to stabilize the amplitude of oscillation. The level of the a-c setpoint is modulated in accordance with the error signal produced by a slow-acting integrator which integrates the difference between the amplitude of the rectified electromechanical oscillator displacement signal and a d-c setpoint value. The electromechanical oscillator is driven to oscillate at the amplitude level established by the d-c setpoint for a prescribed input signal gain condition.

This system is uniquely adaptable to viscosity measurement since the power required to drive the oscillator is a measure of the real or viscous component. To obtain a measurement of elasticity, a phase-locked loop circuit is used as the means for extracting frequency shift information which, as noted, is related to the complex component of viscosity. Additionally, the phase-locked loop circuit provides a means for automatically starting-up the probe oscillation. Normally, this step requires separate start-up circuitry, at additional complexity and expense, particularly for low Q oscillators such as a torsional oscillatory viscometer.

A primary objective of this invention is to provide a means for maintaining both the instantaneous and the time average amplitude of the probe oscillation constant in spite of rapid changes in a sample's physical properties (such as viscosity, temperature change, density, extraneous material dilution, inadequate mixing, stratification, particular material stressed, etc.) to permit accurate and responsive monitoring of process streams for changes in viscosity and elasticity.

DRAWINGS

The following drawings constitute part of the disclosure of this application, of which FIG. 1 is a partial block, partial schematic diagram showing the principles of this invention as applied to a torsional oscillatory viscometer;

DETAILED DESCRIPTION OF THE PREFERRED EMBODIMENTS

Applicant's invention combines, in a unique way, the benefits of a slow-acting integral controller, averaging out the effects of noise, while providing the rapid response realizable from proportional controller negative feedback action to produce a low distortion drive signal for measurement, without the need for a detector to apply proportional control.

Figure 1:
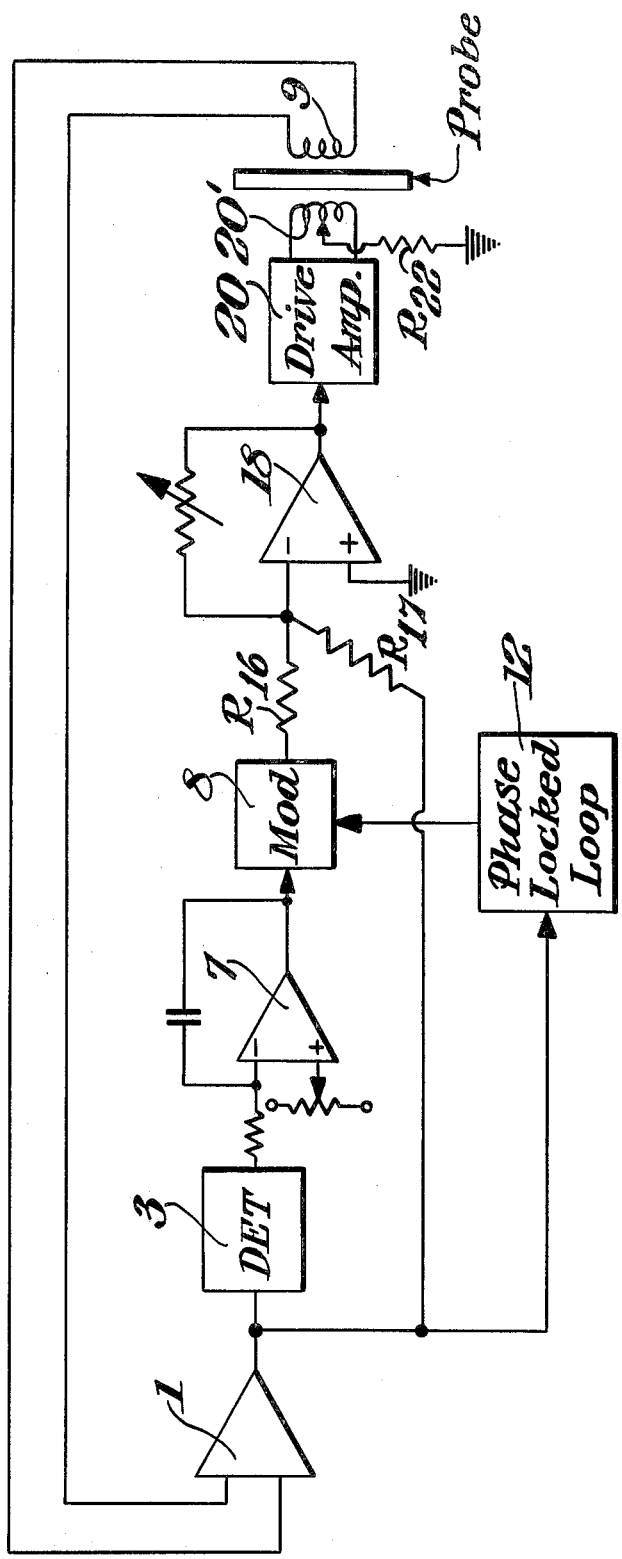
Figure 2:
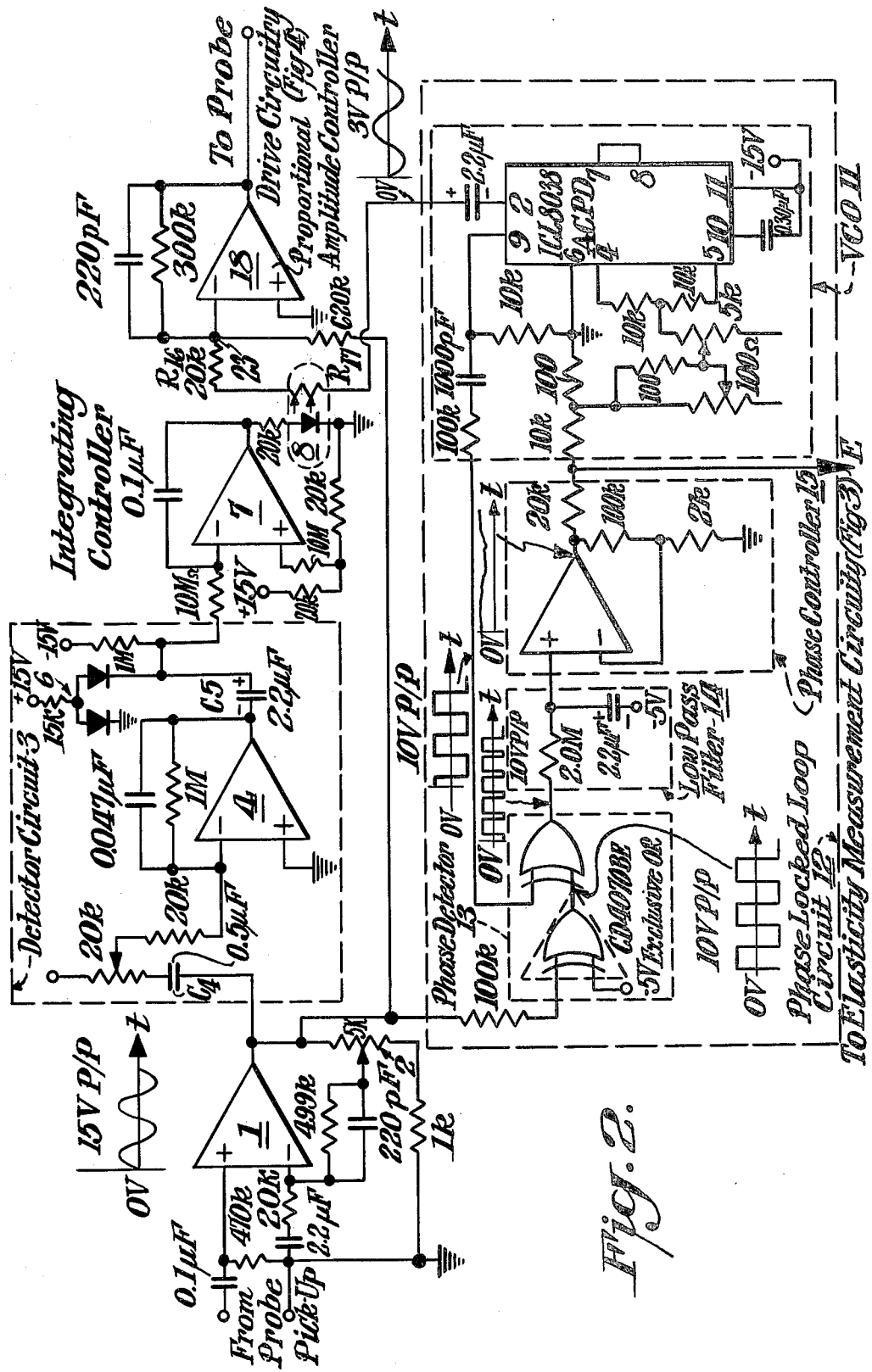
FIG. 2 is a circuit diagram corresponding to the control portion of the diagram of FIG. 1.

Although applicable for any electromechanical oscillator, the probe and the electronic circuitry for a viscometer, as an example, is shown in FIGS. 1 and 2. The circuitry comprises a self-resonant oscillating system whose frequency is determined by the mechanical constants of the probe and its immediate environment. The probe can typically be similar to that disclosed in U.S. Pat. No. 2,819,610. Alternatively, the probe can be of the type described by U.S. Pat. No. 4,034,602, issued to Woo and McGhee on July 12, 1977, which is a planar vibratory system having uses other than viscosity measurement, i.e., modulus of elasticity determinations. The amplitude of oscillation is held at a constant setpoint amplitude in spite of load changes due to varying viscous damping (viscosity). As the probe pickup senses a change in displacement amplitude, the viscometer circuitry varies the probe pulser coil current accordingly to maintain the amplitude constant at the setpoint chosen. For pick-ups which sense changes in probe velocity, circuitry is provided to integrate the velocity signal to convert it to displacement signal form. The probe pulser coil current, measured as a voltage drop across a series resistor, is a function of viscosity of the process stream, whereas the elastic (energy storing) characteristic of the process stream is determined by tracking the operating frequency and measuring its change in the phase-locked loop circuit.

Turning to FIG. 1, the probe output signal, after amplification by amplifier 1, divides into three paths. In the first path, the amplified probe signal passes to a detector circuit 3. After detection (rectification) by detector 3, the resultant d-c signal, is compared with a fixed setpoint voltage at the input terminals of an integrator 7. The integrated difference signal is then applied as a control voltage to a modulator 8, which terminates the first signal path to regulate the constant amplitude of the output signal from a voltage controlled oscillator (VCO) in a phase-locked loop circuit 12. For the case where the probe output is a velocity signal, detector circuit 3 includes an integrator to convert this signal to displacement form.

In the second path, the amplified probe output signal passes to the phase-locked loop (PLL) circuit 12. The function of the PLL circuit 12 is standard, whereby the frequency of a VCO output signal is maintained in lock with the input probe signal as controlled by the phase difference between these two a-c signals, measured by a phase detector. The output of the PLL circuit is a constant amplitude sinusoidal signal which passes through the modulator 8 and current-limiting resistor $R_{16}$, to serve as an a-c setpoint and drive control signal for a proportional amplitude controller 18.

The third signal path is through a resistor $R_{17}$. This latter path furnishes a negative feedback signal to the summing junction joining the second and third signal paths at the inverting input terminal of amplitude controller 18. At this point, a comparison is made between the two signals (the modulated VCO signal and the negative feedback probe output signal) and the resultant difference signal at the output of the proportional amplitude controller 18 is input to a drive amplifier 20 which in turn actuates the probe through drive coils 20'. A pickup coil 9 returns the probe output signal to the input terminals of amplifier 1. A resistor $R_{22}$ may be used to monitor the drive currents in order to obtain a measure of probe drive power.

In this connection, probe drive power is a linear measure of viscosity. Real power is measured by monitoring both probe drive coil currents as these sequentially develop the voltage $V_{REAL}$ across $R_{22}$. Since Power $= V^2 REAL / R_{22}$, the d-c component of the full-wave rectified voltage waveform squared is a measure of real average driving power and, thus, viscosity. However, for small variations in viscosity from a controlled value, as in a typical process control application, the deviation in $V_{REAL}$ is also small and squaring can be omitted for simplicity.

A phase-shift circuit (not shown) may be inserted in series with the probe drive circuit to manually adjust the phasing of the drive signal to enhance TOV sensitivity to changes in process stream elasticity or other dynamic mechanical properties. Such an adjustment is suggested in FIG. 6 of U.S. Pat. No. 4,023,400. [The phase-shifter may typically be a constant amplitude adjustable phase-lag circuit in which the phase of the output signal with respect to the input is a function of signal frequency and the values of the components selected. Refer to *Handbook of Operational Amplifier Circuit Design*—Stout and Kaufman, McGraw Hill (1976), pp. 26-3 to 26-5.]

The advantages of this system are manifold. It is self starting due to the VCO in the PLL. The integrator maintains a constant amplitude as described, whereas the proportional negative feedback through $R_{17}$ stabilizes the response and is applied without distorting the sinusoidal waveform.

FIG. 2 details the circuitry corresponding to the block diagram of FIG. 1 and describes a particular system that has been operated successfully to achieve the advantages of the invention.

Starting with the input signal end of the system, and on the first signal path, an input amplifier 1, being typically an LF355 OPAMP, is configured to operate in the non-inverting mode. In order to block the d-c potential associated with the input signal to this amplifier and to provide only low gain for amplifier d-c offset potentials, 0.1 $\mu$F and 2.2 $\mu$F capacitors are used in conjunction with the 470 kilohm and 20 kilohm resistors, respectively, at the input terminals as shown. This filtering assures the amplifier's output will be close to zero volt under no signal conditions. The two pairs of resistor-capacitor combinations provide the amplifier with a substantially flat frequency response between 3.5 Hz and 1500 Hz. Amplifier gain can be set within a range of 25 to 150 mv peak-peak by means of a 5 kilohm attenuator 2. Although changing the setting of the attenuator 2 will cause a simultaneous momentary change in the signal levels in each of the three output signal paths leading to a detector circuit 3, a phase-locked loop circuit 12 and an amplitude controller 18, respectively, the output of the amplifier 1 will be rapidly restored to its normal 15 V peak-to-peak value by closed loop control action. Thus, the effect of changing the setting of the attenuator 2 is to change the level of the input signal appearing at the non-inverting terminal and, thus, the amplitude of the EMO displacement, while maintaining the signal amplitudes in the three output signal paths constant. Such a constant amplitude condition is desirable for the operation of both a precision a-c detector 6 and a phase detector 13, namely, to avoid effects on detector linearity and phase detector pulse shaping.

Detector circuit 3, connected to the output of the input amplifier 1, comprises a filter circuit 4, a 2.2 μF coupling capacitor $C_5$ and the amplitude detector circuit 6 all connected in series. The filter circuit 4, including a second LF355 operational amplifier, serves as an integrating filter in that, at its normal operating frequency, it provides a 90° phase shift, achieved by integration, and unity gain, derived by adjusting the 20 kilohm potentiometer until the amplitude of the output signal of the filter circuit 4 matches that of the input signal from the amplifier 1 at the normal operating frequency. This filter characteristic serves to convert the pick-up signal from one which is velocity sensitive to one which is a "true amplitude of oscillation" signal, since a proportional signal is produced by integrating a derivative signal. For example, with 120 Hz as the normal operating frequency, the 0.047 μF capacitor provides a 32 kilohm impedance so that, when the total resistances of the 20 kilohm input resistor and the setting of the 20 kilohm potentiometer add up to this value, filter gain becomes unity. The 0.5 μF capacitor $C_4$ is used to block any d-c potentials present at the input of the filter 4.

An electrolytic capacitor $C_5$ (typically, 2.2 μF), connected to the output terminal of the low-pass filter circuit 4, couples the 15 V peak-to-peak signal to an integrator 7 via the amplitude detector 6. After several negative swings, capacitor $C_5$ becomes charged to a −7.5 V peak value. The twin diode arrangement of the amplitude detector 6 is connected to a +15 V supply through a 15 kilohm resistor and effectively clamps the negative-going signal peaks to ground while permitting signal values greater than zero volt to be applied linearly as positive voltages to the integrator 7. An added benefit of this twin diode arrangement is that diode voltage drop and temperature effects on the voltage are neutralized. The 1 megohm biasing resistor to −15 V is used to increase the bleed-off rate of capacitor $C_5$.

The design of the integrator circuit 7 is straightforward. The 0V to +15 V time-varying d-c signal at the output of detector circuit 3 is applied to the inverting input terminal of the integrator circuit 7 through a 10 megohm dropping resistor. Integrator 7, comprising a third LF355 operational amplifier, integrates the difference between the input signal and its average value as established by the 7.5 V reference applied at the non-inverting terminal through a second 10 megohm resistor. The integrated error signal thus produced drives a photo conductor modulator 8 through a 20 kilohm current-limiting resistor, to regulate the strength of the reference a-c setpoint signal passing from a VCO 11 into the amplitude controller 18, The second signal path connects the output terminal of the input amplifier 1 with the phase-locked loop circuit 12 and, in particular, to one of three input terminals of a phase detector 13. Phase detector 13 is typically a CD 4070 BE exclusive OR gate module. The second input of this module 13 constitutes a −5 V reference signal for use in the amplifier portion of the module to convert the input sinusoid signal from the amplifier 1 to square-wave form. [This conversion is effected by amplification followed by clipping of the peaks from the input sinusoid waveform to form a square wave.]

The converted input sinusoid signal is then in condition to be compared with the 10 volt peak-to-peak square wave output signal from VCO 11, applied to the third input terminal in the exclusive OR gate portion of module 13, which is the means used to detect the phase difference between the two signals. The exclusive OR gate phase detector module produces a normally symmetrical square wave, switching abruptly between a −5 V and +5 V level at twice the input frequency only when the two input signals are exactly 90° out of phase. At phase differences other than 90°, either the (+) or the (−) half of the output a-c waveform will be wider than the other and thus becomes unsymmetrical about the 0V axis. This condition is shown in the figure.

A low-pass filter 14, comprising a 2.0 megohm resistor and a 2.2 μF capacitor, is used to produce a true average value of the resultant square wave signal as input to a high gain phase controller 15 using a zero volt setpoint. [Since the time constant for the filter 14 is 4.4 seconds, the break point in the gain characteristic occurs at a very low frequency cut-off, namely 0.037 Hz. Thus, at a roll-off of −20 db per decade, frequency components above 0.37 Hz become insignificant, and the d-c component, which is the time average value, dominates. The result is a waveform such as shown at the output of the phase controller 15.] The output terminal of phase controller 15 is connected to the control terminal of VCO 11 through a 100 ohm voltage divider network to produce a vernier type voltage control signal needed to make fine changes in VCO frequency. In addition, since the output signal from phase controller 15 is a d-c voltage which varies with any frequency shift of the system, it is a measure of the deviation of elasticity E which is processed by the sub-circuit detailed in FIG. 3. [Elasticity E and viscosity η signals are processed by essentially identical circuits.]

Figure 3:
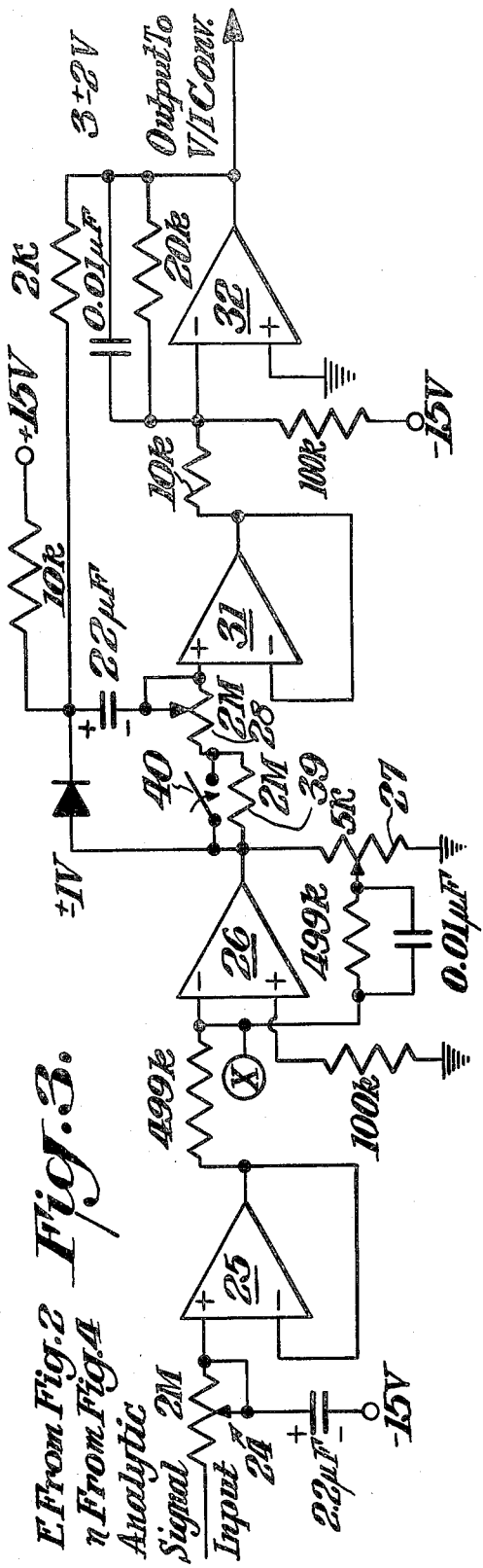
FIG. 3 is a subcircuit for measuring elasticity and viscosity signals.

Referring to FIG. 3, the input signal passes through a 4.4 second time constant low-pass filter, indicated generally by 24, for smoothing before it passes through a buffer circuit 25 and thence into a span adjust amplifier 26, provided with a 5 kilohm span adjust potentiometer 27. Further smoothing of the input signal is accomplished by means of a second low-pass filter circuit 28. Manual switch 40, shunting a 2 megohm resistor 39, is provided as a coarse adjustment to the filter 28 time constant (typically, up to 3 minutes), whereas the potentiometer to the right thereof is the vernier adjustment. The analytic signal then passes through a buffer stage 31 and thence to a voltage amplifier 32, being stabilized by a small 0.01 μF feedback capacitor, to provide sufficient voltage such that after voltage-to-current conversion (not shown), a 4–20 ma load can be handled.

Returning now to FIG. 2, VCO 11, typically an ICL 8038 ACPD, includes a network of two 10 kilohm series connected resistors which serve to balance the duty cycles of the square wave and sinusoid VCO output signals, which are 90° out of phase with one another, whereas the 5 kilohm and 100 ohm potentiometers, in conjunction with the 0.30 μF capacitor, establish the median frequency of operation. The constant amplitude square wave VCO output signal returns as feedback to the input of phase detector 13 after passing through the series-connected 1000 pF capacitor and 100 kilohm resistor, which respectively block extraneous d-c voltages and limit energy transfer.

Finally, the 3-volt constant amplitude sinusoid signal output terminal of VCO 11 is connected to a summing junction 23 at the inverting terminal of amplitude controller 18 via a 2.2 μF blocking capacitor, a photo conductor modulator 8 and a 20 kilohm current-limiting resistor $R_{16}$.

At the summing junction 23, the quasi-positive feedback signal path from VCO 11, as amplitude-modulated by the photo conductor 8, joins the third signal path which transmits the negative feedback signal from input amplifier 1. A 620 kilohm process-sensing resistor $R_{17}$ senses the instantaneous changes in the process stream probe velocity output signal waveform from the output of amplifier 1 and applies this signal to the summing junction. Alternatively, the input of $R_{17}$ can be connected to the wiper arm of the attenuator 2 to provide constant proportional gain. An amplifier controller 18 serves as a proportional controller of fixed gain, responding rapidly to changes in the probe velocity signal amplitude from input amplifier 1, but more slowly to changes in probe displacement amplitude as a function of the size of the integrated error signal generated by integrator 7. The output terminal of controller 18 is connected to the input of the probe drive circuit of FIG. 4 via the series-connected variable phase shift network (not shown) described earlier.

Figure 4:
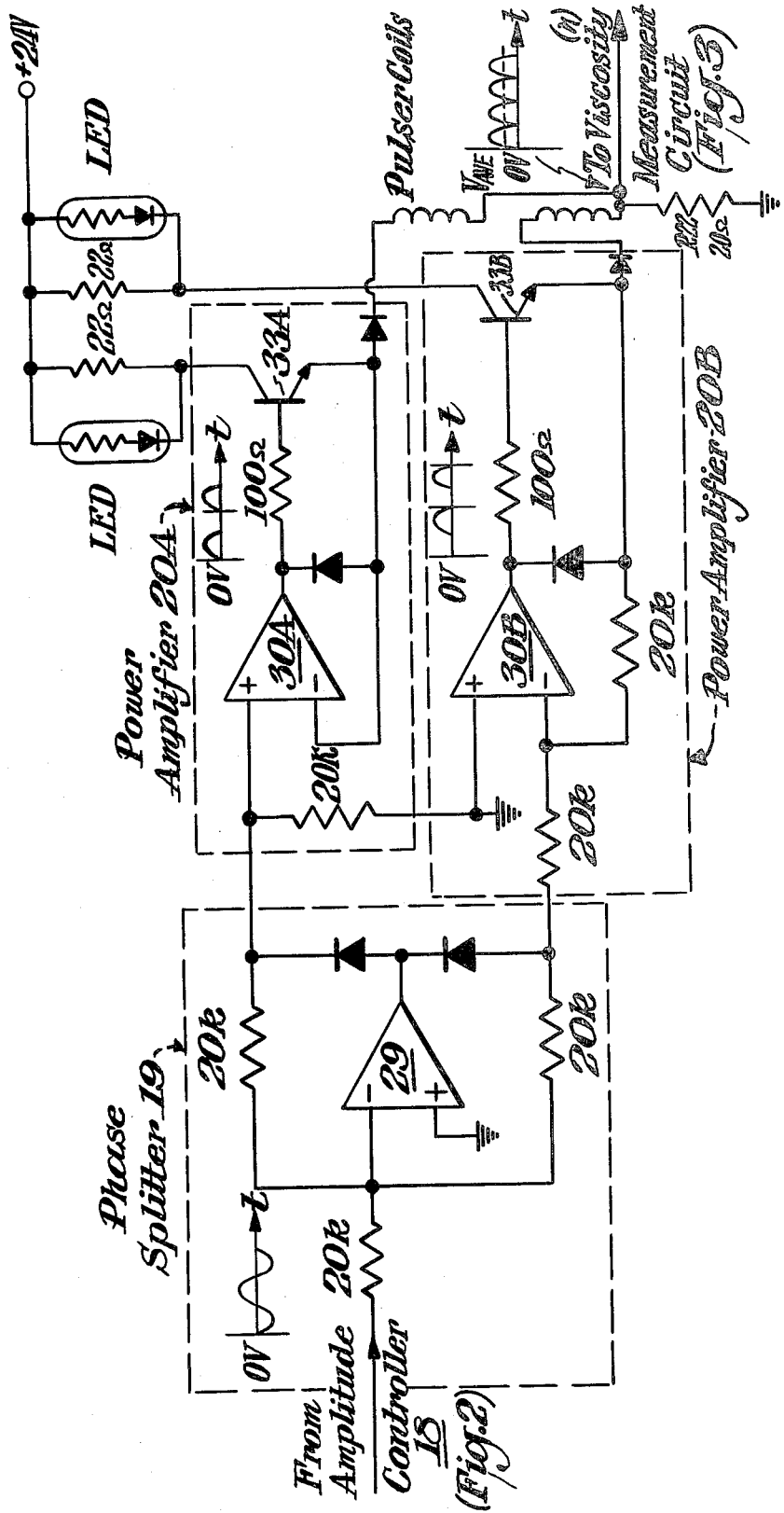
FIG. 4 is a probe drive circuit.

Now referring to FIG 4, the probe drive signal thence passes through a phase splitter circuit 19, which directs the individual half waves to power amplifiers indicated generally at 20A and 20B, respectively. The signal input to operational amplifier 30B is via its inverting terminal, so that this signal portion is rectified to the same positive polarity as the signal output from operational amplifier 30A. Each signal thence passes to the bases of transistors 33A and 33B (typically, Texas Instruments Co. TIP 33's), respectively, which control the higher power flow from the 24 V supply to ground, alternately delivered to each pulser coil. [The light-emitting diode (LED), 22 ohm resistor-shunted sub-circuits, connected in series with the respective collector elements of transistors 33A and 33B, are provided to afford the operator a visual check of the probe power level.] The two halves of the analytic signal recombine in a resistor $R_{22}$ (typically, 20 ohms) to give a viscosity measurement signal delivered to the circuitry of FIG. 3, hereinbefore described.

Figure 3A:
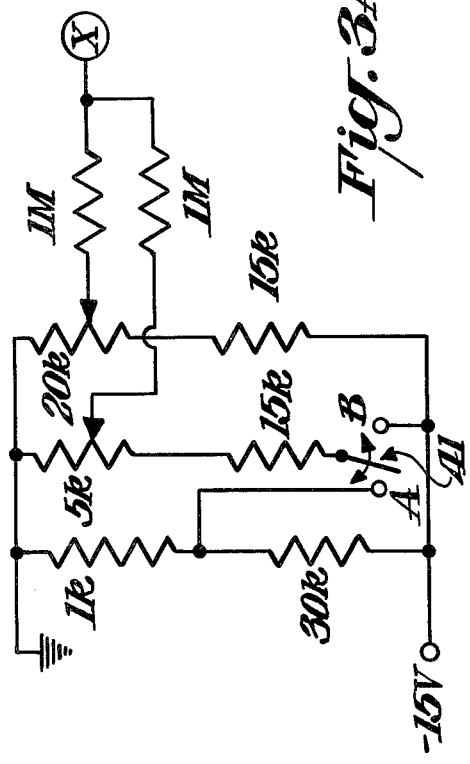
FIG. 3A is a subcircuit for zero setting the viscosity signal measured by the circuitry of FIG. 3.

In order to bias out a selected amount of the viscosity signal prior to further amplification, the optional zero-set network shown in FIG. 3A, connects into the measurement circuit of FIG. 3, at the points denoted $\widehat{x}$. This circuit permits precise selection of a zero base by suitable coarse and fine adjustments of the two potentiometers, with range selection effected by manual operation of switch 41.

At system start-up, before a probe pick-up signal appears at the output of amplifier 1, integrator 7 calls for a maximum signal. Consequently, the full 3 V VCO 11 output signal, near the system natural frequency, becomes a strong, moderately clipped sine wave of over 30 volts peak-to-peak at the output of amplitude controller 18 to initiate probe oscillation.

In the event a displacement pickup is employed instead of a velocity pickup, the 90° phase difference must be accomodated. This may be accomplished using well-known techniques. For example, a 0° phase detector could be used in the phase locked loop and the phase angle of the proportional control signal could be similarly adjusted. Alternatively, the phase angle can be made adjustable by deriving the proportional control signal from the wiper of a potentiometer coupling the output of the filter circuit 4 (FIG. 2) to the output of the input amplifier 1. This accomodates adjustable leading phase angles in the control loop which is beneficial to control band width.

While the foregoing detailed description is directed to a torsional viscometer, constant amplitude drives are essential in many other uses such as, for example, infrared spectroscopic photometry, employing oscillating mirrors. Scanning mirror drives generally are also preferably constant amplitude types and, in fact, all systems wherein frequency control or measurement is sought, since these systems can tolerate only very small variations in amplitude without influencing frequency.

We claim:

1. A method for maintaining the amplitude of an electromechanical oscillator mechanical output signal constant independent of its operating frequency, comprising the steps of:
   generating a constant amplitude a-c signal in phase agreement with said output signal;
   developing a d-c signal related to said output signal amplitude;
   continuously integrating the difference in voltages between said d-c signal and a preselected setpoint voltage value to provide a control signal;
   amplitude modulating said constant amplitude a-c signal with said control signal to provide a modulated a-c signal in phase with said output signal to maintain said oscillator in oscillation; and
   maintaining the amplitude of said output signal in accordance with the algebraic sum of a linear negative feedback signal derived from said output signal and said modulated a-c signal, thereby to maintain said output signal amplitude constant.

2. An electromechanical oscillatory system providing a constant amplitude mechanical output signal independent of its operating frequency, said system having an input drive and an output and comprising:
   a phase-locked loop circuit connected to the output of said system generating a constant amplitude a-c signal;
   an amplitude detector coupled to the output of said system producing a time-varying d-c signal tracking said output signal;
   an integrator connected to the output of said detector integrating the difference between said time-varying d-c signal and a preselected setpoint signal;
   a modulator means connected to the output terminal of said integrator for modulating said a-c signal as a function of the magnitude of said integrated d-c signal to provide a modulated a-c signal in phase with said output signal to maintain said oscillator in oscillation; and
   a summing junction coupled to the outputs of said system for summing a linear negative feedback signal derived from said output and said modulator means to provide a drive control signal as feedback to said system in accordance with the magnitude of the difference between said modulated a-c signal and said negative feedback signal.

3. The system of claim 2 wherein said system is a torsional oscillatory viscometer probe and includes attenuator means for adjusting the amplitude of oscillation of said probe.

4. The system of claim 2 wherein said modulator means is a photo conductor.

5. The system of claim 2 wherein said detector comprises a low-pass filter circuit connected in series with a precision a-c detector.

* * * * *